United States Patent [19]

Bingham

[11] Patent Number: 5,594,381
[45] Date of Patent: Jan. 14, 1997

[54] REVERSE CURRENT PREVENTION METHOD AND APPARATUS AND REVERSE CURRENT GUARDED LOW DROPOUT CIRCUITS

[75] Inventor: David Bingham, San Jose, Calif.

[73] Assignee: Maxim Integrated Products, Sunnyvale, Calif.

[21] Appl. No.: 235,688

[22] Filed: Apr. 29, 1994

[51] Int. Cl.[6] ........................................ H03K 3/01
[52] U.S. Cl. ............................. 327/534; 327/29; 327/434
[58] Field of Search .............................. 327/29, 534, 382, 327/434, 436, 437, 560, 563; 365/229

[56] References Cited

U.S. PATENT DOCUMENTS

| | | | |
|---|---|---|---|
| 4,066,918 | 1/1978 | Heuner et al. | 327/318 |
| 4,556,804 | 12/1985 | Dewitt | 327/434 |
| 4,847,522 | 7/1989 | Fuller et al. | |
| 4,988,894 | 1/1991 | Takiba et al. | 327/437 |
| 5,157,291 | 10/1992 | Shimoda | 327/434 |

*Primary Examiner*—Timothy P. Callahan
*Assistant Examiner*—Jung Ho Kim
*Attorney, Agent, or Firm*—Blakely, Sokoloff, Taylor & Zafman

[57] ABSTRACT

A reverse current limited circuit configured to provide a reverse current limited low dropout voltage output. The reverse current limited circuit, coupled between a pair of terminals, comprises (i) a MOS pass transistor coupled in series between the first and second terminals, (ii) connection circuitry to connect the substrate of the MOS pass transistor to either one of the pair of terminals based on the relative magnitudes of the voltages measured on the pair of terminals, (iii) activation circuitry for turning on and off the MOS pass transistor based on the relative magnitudes of the voltages measured on the pair of terminals and (iv) comparison circuitry used to compare the voltages of the pair of terminals and to control the activation circuitry and the connection circuitry in response to the comparison made.

22 Claims, 8 Drawing Sheets

REVERSE CURRENT PREVENTION METHOD AND APPARATUS AND REVERSE CURRENT GUARDED LOW DROPOUT CIRCUITS

BACKGROUND OF THE INVENTION

1. Field of the Invention

The present invention relates to the field of power supply circuits, low dropout regulators, linear regulators, pass elements and the like wherein protection of electrical components is required when the output voltage is greater than the input voltage.

2. Prior Art

Although there are many MOS and CMOS linear voltage regulators currently available in monolithic form, none of these regulators is protected against the situation where the output voltage can be greater than the input voltage. Although there are many applications where this is not a concern, new multiple powered systems using batteries and line operated power sources require that the system voltage(s) be maintained under discharge, failure or turn-off of one or possibly more of the input power supplies. This means that if an input power supply is connected to a system through a linear regulator having a MOS pass element, reverse current could flow through the pass element from the output of the linear regulator to the input power supply. At the least, this is undesirable since it wastes power and at the worst, if the reverse current is high, component or system damage may result. Although this discussion will use the linear regulator as an example, the invention is not limited to linear regulators since there are other regulator topologies such as buck switching regulators that could benefit from the invention.

To date the most popular monolithic linear voltage regulators have been fabricated using bipolar semiconductor technologies where the reverse characteristics (reverse current gain etc.) of a pass transistor are generally much inferior to the forward characteristics. Consequently, for a given base current, the reverse collector current would be a couple of orders of magnitude less than the forward collector current. In addition, most bipolar regulators detect when the pass transistor goes into saturation and automatically reduce the base drive current. The result of this is that, although reverse current may flow, it is often of a relatively low value and, for most applications, is not a problem.

BRIEF SUMMARY OF THE INVENTION

The present invention discloses a reverse current limited circuit for coupling between first and second terminals for providing a reverse current limited low dropout output having an MOS pass transistor coupled in series between the first and second terminals, means for connecting the substrate of the MOS pass transistor to either one of the first terminal and the second terminal based on the relative magnitudes of the voltages of the first and second terminals, means for turning on and off the MOS pass transistor based on the relative magnitudes of the voltages of the first and second terminals, and means for comparing the voltages of the first and second terminals and controlling the means for turning on and off the MOS pass transistor and the means for connecting the substrate of the MOS pass transistor to either of the first and second terminals.

DETAILED DESCRIPTION OF THE INVENTION

The invention relates to linear voltage regulators that use MOS pass transistors. In general, these will be fabricated using silicon monolithic processes whereby most, if not all components, will be integrated together on a single chip. There will be occasions where total integration will not be used. For example, in high power applications, the pass transistor may be a discrete transistor separate from the control circuitry which usually takes the form of an IC, and the discrete transistor has its substrate as a separate terminal instead of being connected to its source.

Figure 8:
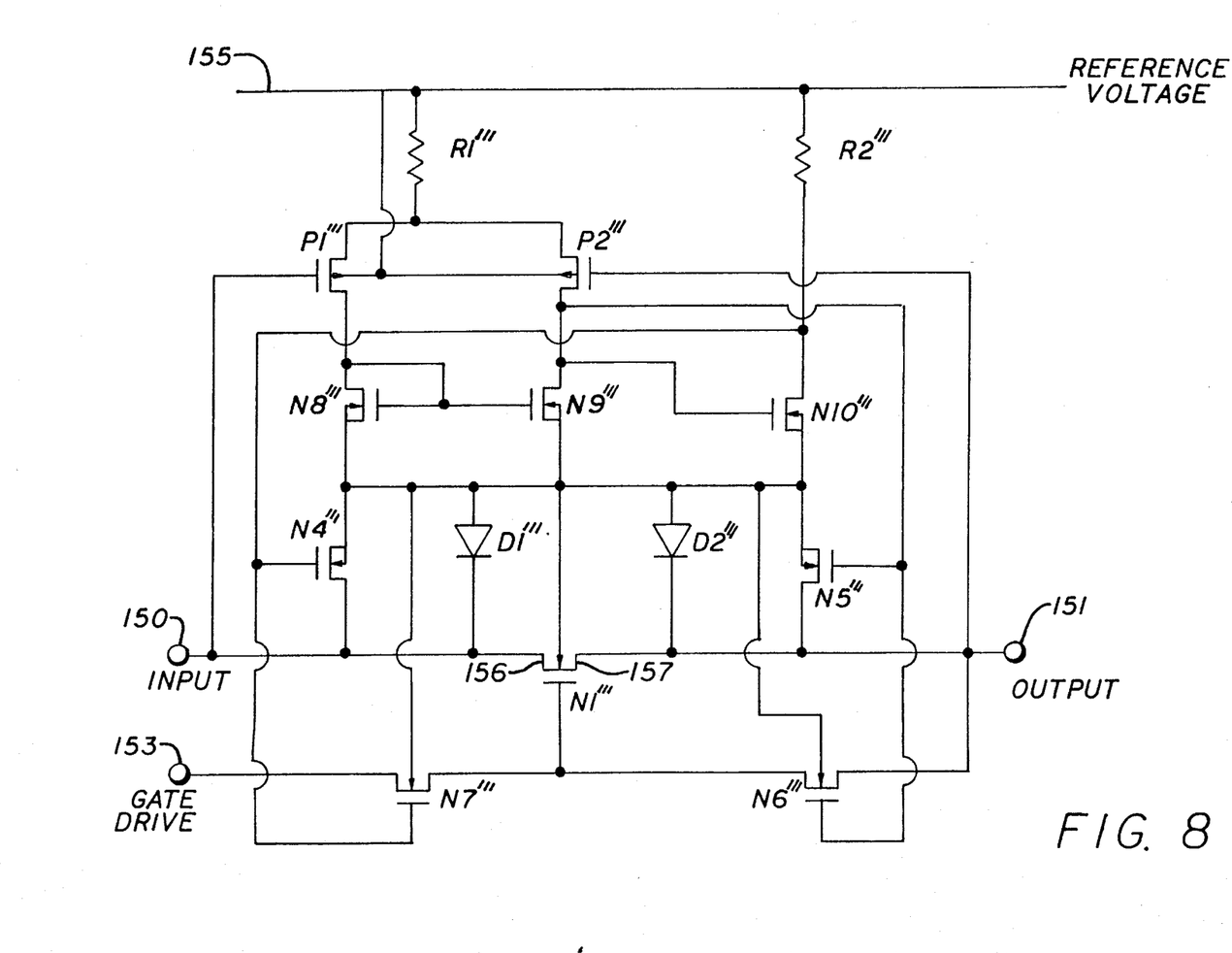
FIG. 8 is a block schematic of a practical implementation of a low dropout negative series regulator incorporating an NMOS substrate snatcher circuit and a medium precision polarity detector circuit in accordance with the present invention.

The essence of the invention is 1) to detect whether the output node voltage of a regulator is higher than the input node voltage of the regulator, 2) if so, to turn off a pass transistor, which couples the input and the output nodes of the regulator, by turning off its gate, 3) to connect the substrate terminal of the pass transistor to the output node of the regulator and 4) if relevant, to connect the substrates of PMOS transistors and components of the control circuitry to the output node of the regulator. This type of linear regulator is called a positive series regulator. The invention applies also to negative series regulators where the input voltage polarity is reversed and where an NMOS pass transistor (N1) would be used as shown in FIG. 8. The detailed operation of the circuit will be discussed later in this section.

Figure 1A:
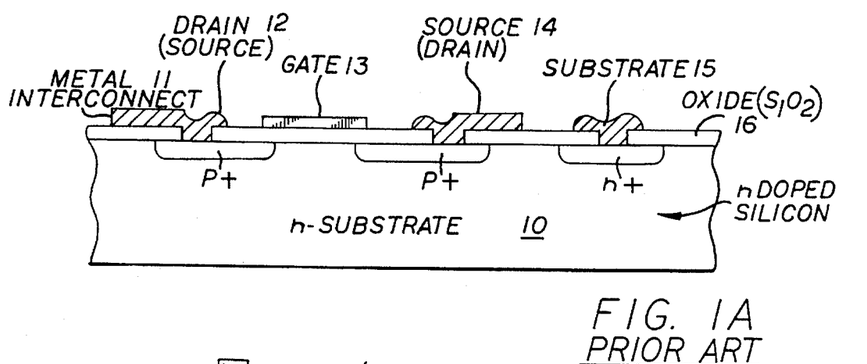
FIG. 1A is a cross sectional view of a PMOS transistor.
Figure 1B:
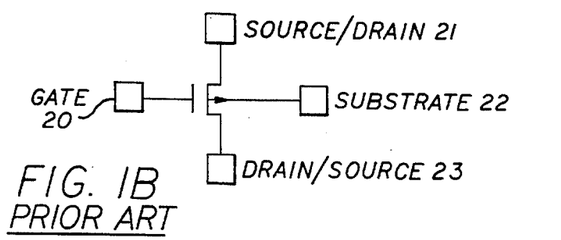
FIG. 1B is a symbol of a PMOS transistor.

An MOS transistor is a four terminal device having a source, a drain, an insulated gate and a substrate. FIG. 1A shows a cross sectional view of a PMOS transistor. Because a drain 12 and a source 14 are the same in structure, they are interchangeable. Drain 12 and source 14 are P-type, while a substrate 10 is an N-type material. A PMOS transistor has two inherent diodes formed between drain 12 and substrate 10 and between source 14 and substrate 10. However, in many applications, because substrate 10 is connected to source 14, only one inherent diode exists between drain 12 and substrate 10. FIG. 1B shows a symbol of a PMOS transistor including a gate 20, a source 21, a substrate 22 and a drain 23. Because a source and a drain are interchangeable as stated above, if node 21 is a drain, then node 23 is a source. Thus, it should be noted that for the discussions that follow and the claims, a drain and a source may be recited interchangeably.

Figures 1C, 1D:
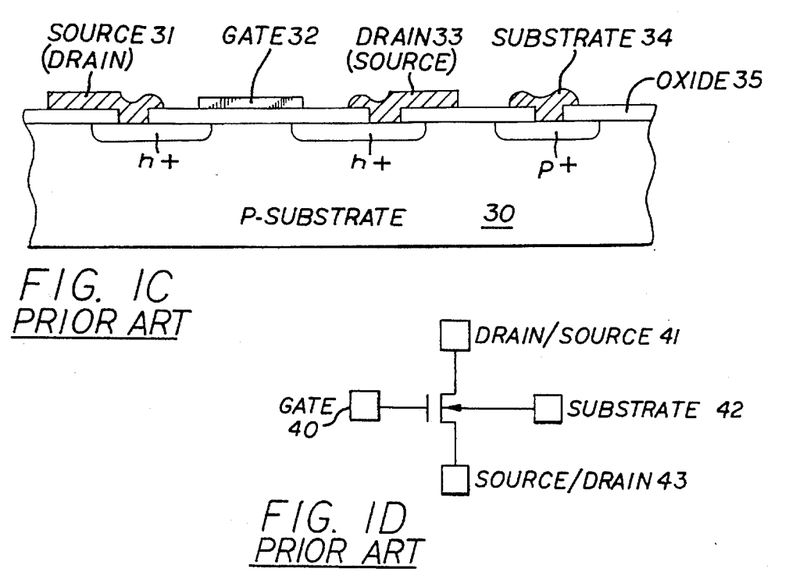
FIG. 1C is a cross sectional view of an NMOS transistor.
FIG. 1D is a symbol of an NMOS transistor.

FIG. 1C presents a cross sectional view of an NMOS transistor. A substrate 30 is a P-type material while a drain 33 and a source 31 are N-type materials. Again, two inherent diodes are formed between drain 33 and substrate 30 and between source 31 and substrate 30. However, if substrate 30 is connected to source 31, then only one diode exists between drain 33 and substrate 30. FIG. 1D is a symbol of an NMOS transistor.

Figure 2A:
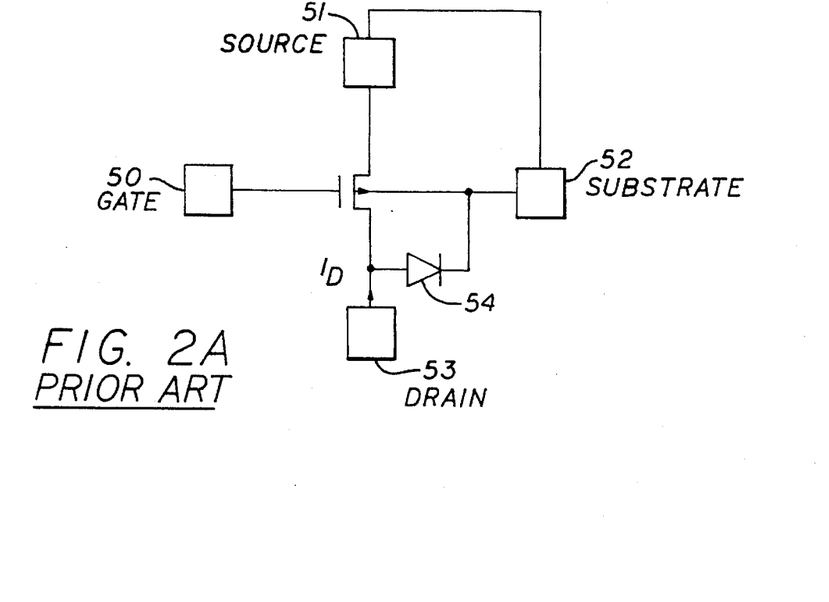
FIG. 2A presents a symbol of a PMOS transistor having the source and the substrate of the PMOS transistor being tied together and showing a parasitic diode at the junction of the drain and the substrate of the PMOS transistor.

FIG. 2A presents a symbol of a PMOS transistor having a source 51 and a substrate 52 being tied together and showing a parasitic diode 54 at the junction of a drain 53 and substrate 52. FIG. 2C presents a symbol of an NMOS transistor having a source 73 and a substrate 72 being tied together and showing a parasitic diode 74 at the junction of a drain 71 and substrate 72. During a normal operation, source 51 of the PMOS transistor is the most positively biased of either of drain 53 or source 51, while in an NMOS transistor, drain 71 is the most positively biased of either of drain 71 or source 73. In many applications, a substrate is connected to a source resulting in one parasitic pn diode such as 54 or 74 being placed between a drain and a source. Consequently, if the drain-to-source voltage is reversed, diode 54 or 74 becomes forward biased and conducts.

Figure 2B:
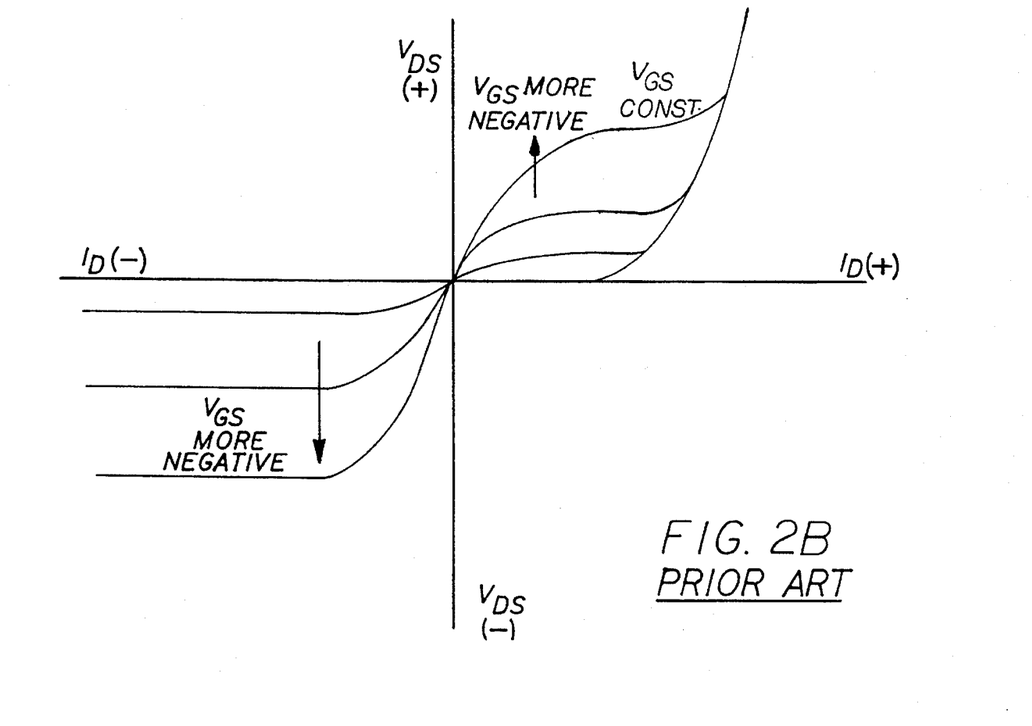
FIG. 2B presents typical I-V characteristics of a PMOS transistor.
Figure 2C:
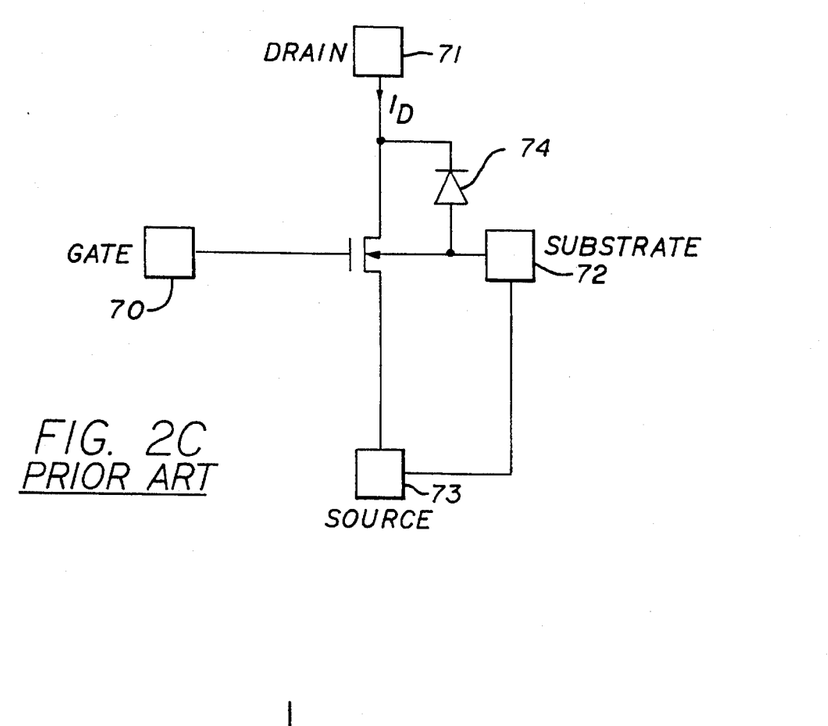
FIG. 2C presents a symbol of an NMOS transistor having the source and the substrate of the NMOS transistor being tied together and showing a parasitic diode at the junction of the drain and the substrate of the NMOS transistor.
Figure 2D:
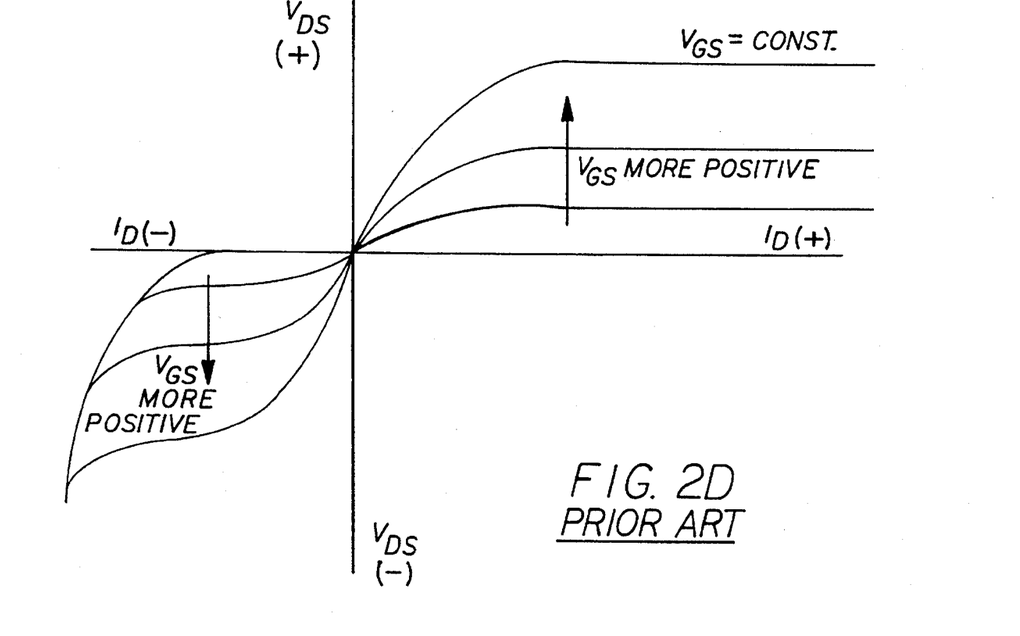
FIG. 2D is typical I-V characteristics of an NMOS transistor.

FIG. 2B shows the forward and reverse biased characteristics of a PMOS transistor. During a normal operation, $V_{DS}$ is negative. But when $V_{DS}$ is positive, as $V_{GS}$ becomes more negative, high drain current flows due to parasitic diode 54. FIG. 2C shows similar I–V characteristics for an NMOS transistor. During a normal operation of a NMOS transistor, $V_{DS}$ is positive. But when $V_{DS}$ is negative, as $V_{GS}$ becomes more positive, high drain current flows due to parasitic diode 74. If one desires to block current in the reverse direction which is drain-to-source current in a PMOS and source-to-drain current in an NMOS, two conditions must be met:

1) In a PMOS transistor, the source-to-gate voltage must be less than the absolute value of the turn-on voltage of the PMOS transistor. In an NMOS transistor, the gate-to-source voltage must be less than the turn-on voltage of the NMOS transistor.

2) The substrate must be connected either to the source or to a voltage similar to that of the source so as not to affect the turn-on voltage of a PMOS or an NMOS transistor.

The invention uses a comparator to detect the biasing of a PMOS pass transistor coupled between the input and the output nodes of a regulator to determine whether the PMOS pass transistor is being used in the forward or reverse mode. The comparator connects the substrate of the PMOS pass transistor to either of the two terminals named drain and source (which ever is most positive), and if the transistor is biased in the reverse mode, the source-to-gate voltage is forced to zero. Also if there are PMOS transistors on the chip containing the control circuitry of the linear regulator, their substrate(s) are also switched to the most positive of the input or output voltage. The above discussion applies equally to whether the PMOS pass transistor is contained on a chip or whether it is a separate discrete transistor.

Figure 3:
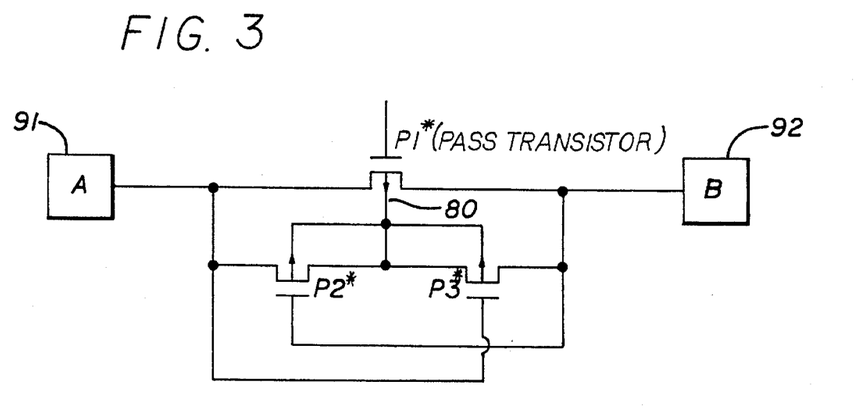
FIG. 3 presents a simple substrate snatcher circuit for MOS transistors connected to varying supply terminals.

An extremely simple circuit is shown in FIG. 3 for connecting a common substrate 80 of the three transistors P1*, P2* and P3* to the most positive of the terminals A 91 and B 92. If transistor P1* is assumed to be the pass transistor, P2* and P3* can aptly be called the substrate snatchers. If node A 91 is significantly more positive than node B 92 and is higher than the turn-on voltages of the PMOS transistors, transistor P2* will be turned on and will connect common substrate(s) 80 of all three transistors to node A 91. Similarly if node B 92 is significantly more positive than node A 91, transistor P3* will be turned on, connecting the common substrate(s) 80 to node B 92. The circuit works well if the voltage difference between nodes A 91 and B 92 is greater than the turn-on voltage of the PMOS transistors and also if the voltages on nodes A 91 and B 92 are low, but at least one of them is greater than the turn-on voltage of a PMOS transistor. This circuit is not adequate by itself for substrate control but complements other circuits because of its excellent low voltage performance and simplicity.

Figure 4:
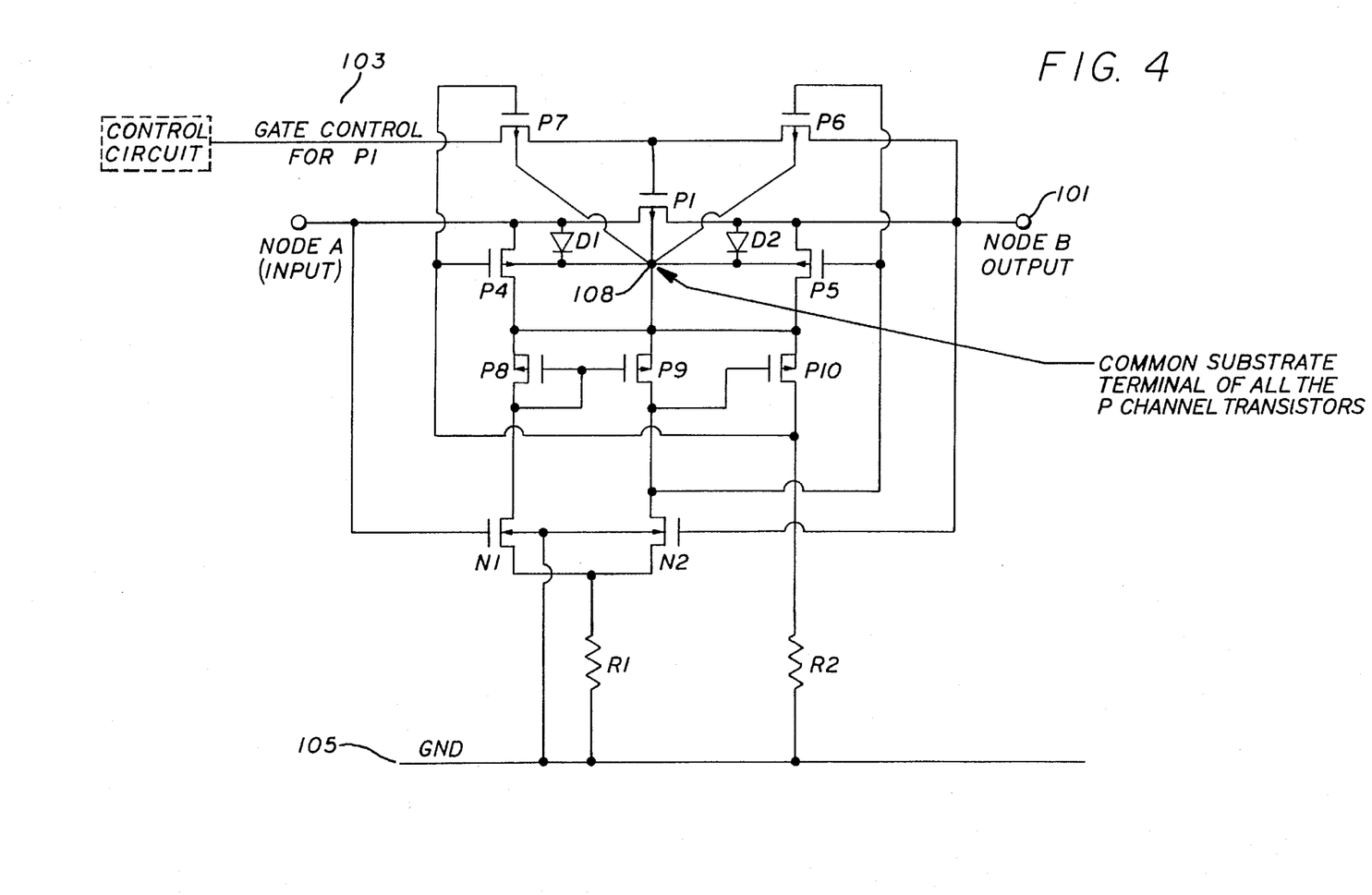
FIG. 4 is a block schematic of a practical implementation of a low dropout regulator incorporating the substrate snatcher circuit of FIG. 3 and a medium precision polarity detector circuit in accordance with the present invention.

A medium precision polarity detector is shown in FIG. 4. The detector includes transistors N1, N2, P8, P9 and P10. The detector is a conventional differential comparator whose outputs drive two substrate snatcher transistors P4 and P5 that connect common substrate(s) 108 for the PMOS transistors to either node A 100 or B 101. Additionally, the outputs from the comparator either connect the gate of P1 to node B 101 through P6 (turning P1 off) or when node A 100 is more positive than node B 101, to a drive 103 from the output of an error amplifier or other suitable driver.

In more detail, the inputs from nodes A 100 and B 101 drive the gates of N1 and N2 of the first stage of the differential comparator. The first stage is self biasing such that the current in R1 is defined as approximately the voltage on node A 100 less the turn-on voltage of N1 (taking into account the reverse bias of the substrate of N1) divided by the value of R1. The output of the first stage of the comparator is taken from the drains of N2 and P9 and drives the gate of P10. The second stage consists of P10 and R2 and provides an anti-phase signal to that of the first stage. These two output signals drive the gates of P4, P5, P6 and P7. Note that the common substrate node 108 supplies the bias current for the comparator. Initially at power on, this current is supplied through the parasitic diodes being the inherent PN junctions formed by the substrate and sources of P4 and P5 (either D1 or D2 depending on whether node A 100 is higher than node B 101 or visa versa) and, in normal operation, through P4 or P5 whichever is on.

The operation of a medium precision polarity detector shown in FIG. 4 is described in detail below: when the voltage of node A 100 ($V_A$) and the voltage of node B 101 ($V_B$) are less than the turn-on voltage of N1 ($VT_1$) and the turn-on voltage of N1 ($VT_2$) respectively, common substrate terminal 108 is connected to node A 100. Because the gate-to-source voltage of N1, $VGS_{N1}$, and the gate-to-source voltage of N2, $VGS_{N2}$, are less than $VT_1$ and $VT_2$ respectively, transistors N1 and N2 are off. Accordingly, transistors P5, P6 and P10 will be off, and transistors P4 and P7 whose gates are connected to ground 105 through R2 will be on. Therefore, a gate control 103 for P1 will control the gate of P1 through P7, and common substrate terminal 108 will be connected to node A 100 through P4.

When $V_A$ and $V_B$ are greater than $VT_1$ and $VT_2$ respectively, and $V_A$ is greater than $V_B$ (normal operation), common substrate terminal 108 is connected to node A 100. Initially, common substrate terminal 108 is connected to node A 100 through a parasitic diode D1, but during normal operation, common substrate terminal 108 is connected to node A 100 through the substrate snatcher transistor P4 as described below. When transistors N1, N2, P8 and P9 turn on, initially a current flows from node A 100 through D1 and splits into two branches. One branch follows through P8, N1, R1 and to ground 105 while the other branch goes through P9, N2, R1 and finally to ground 105. Since $VGS_{N2}$ is less than $VGS_{N1}$, the drain-to-source voltage of N2, $VDS_{N2}$, tends to increase to maintain the same amount of current through N2 as through N1. Because the source-to-gate voltage of P6, $VSG_{P6}$, which is $VT_2-VDS_{N2}$, should be smaller than the turn-on voltage of P6, $VT_6$, transistor P6 will be off, disconnecting the pass transistor P1 from node B 101. Transistors P5 and P10, whose gates are connected to the drain of N2, like the gate of P6, will be off for similar reasons. Since the gates of transistors P4 and P7 are connected to ground 105 through R2, and P5 and P10 are off, P4 and P7 will be turned on. At this point, common substrate terminal 108 will be connected to node A 100 through P4, and P1 will be controlled by gate control 103 through P7.

On the other hand, when $V_B$ is larger than $V_A$, and $V_A$ and $V_B$ are greater than $VT_1$ and $VT_2$ respectively, common substrate terminal 108 is connected to node B 101. Initially, common substrate terminal 108 is connected to node B 101 through D2, but in normal operation, common substrate terminal 108 is connected to node B 101 through transistor P5. When transistors N1, N2, P8 and P9 turn on, initially a current flows from node B 101 through D2 and splits into two branches. One branch continues through P8, N1, R1 and to ground 105 while the other branch goes through P9, N2, R1 and finally to ground 105. Since $VGS_{N2}$ is larger than $VGS_{N1}$, $VDS_{N2}$ tends to decrease to maintain the same mount of current through N2 as through N1. Because the value $VDS_{N2}$ is small, $VSG_{P6}$, which is $VT_2-VDS_{N2}$, should be larger than the turn-on voltage of P6, $VT_6$, and consequently transistor P6 will be on, connecting the gate of the pass transistor P1 to node B 101. Transistors P5 and P10 will turn on for similar reasons. Now the current will flow from node B 101 through P5 and split at common substrate terminal 108 into three branches. One branch will continue through P8, N1, R1 and to ground 105. Another branch will continue through P9, N2, R1 and to ground 105, and the third branch will continue through P10, R2 and to ground 105. Since P5 and P10 are on, the drain voltage of P10 approximately equals $V_B$, and thus, P4 and P7 whose gates are connected to the drain of P10 will be off. Since P7 is off, and P6 is on, the gate of P1 is disconnected from gate control 103 and is connected to node B 101. Thus, P1 is off, and common substrate terminal 108 is connected to node B 101 through P5.

The relatively simple circuit of FIG. 4 is shown to demonstrate the invention and is obviously only one of many circuits that could provide the same function.

Figure 5:
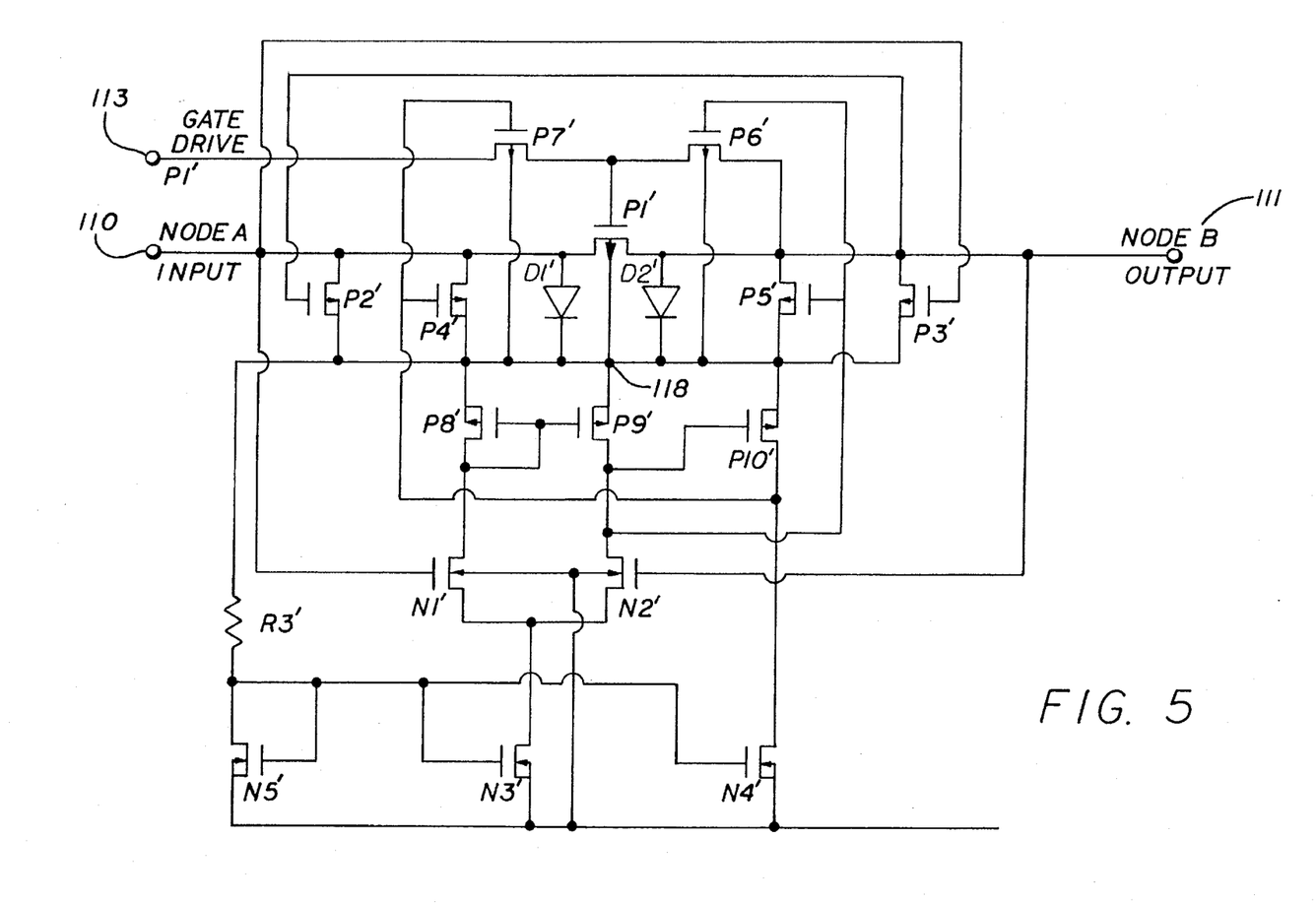
FIG. 5 is a circuit diagram for the regulator circuit of FIG. 4 with an improved precision polarity detector circuit.

FIG. 5 shows an improved precision polarity detector which differs from the circuit shown in FIG. 4 by replacing R1 and R2 of FIG. 4 by N3' and N4', and by adding P2' and P3' to provide a more complex but improved bias scheme. R3' together with N5' set up a bias current which is mirrored in N3' and N4'. This provides significantly more gain for the second stage of the comparator and subsequently more precise detection of which input—node A 110 or node B 111—is higher in voltage.

Figure 6:
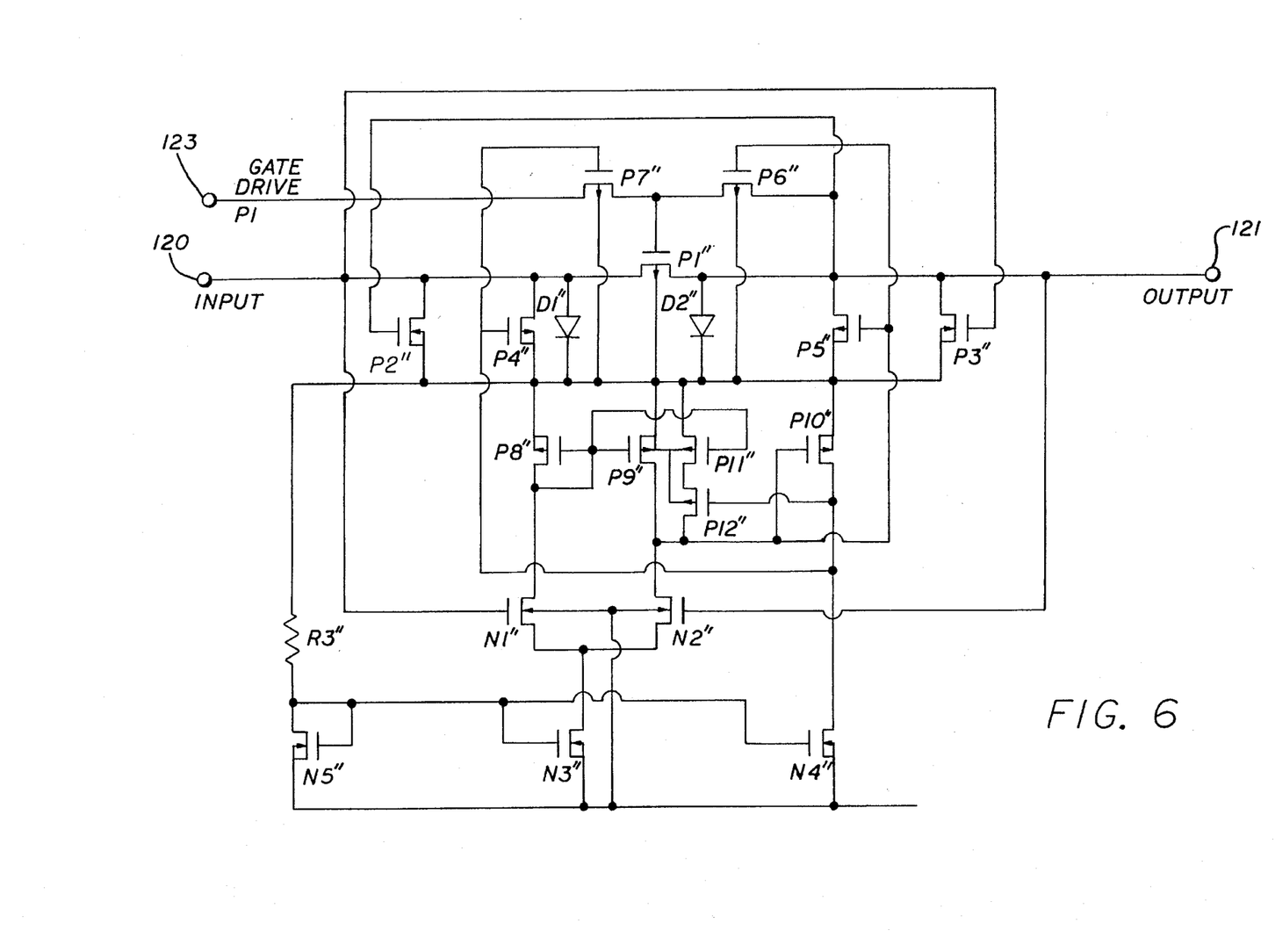
FIG. 6 is a circuit diagram for the regulator circuit of FIG. 5 with a hysteresis circuit.

A further improvement is shown in FIG. 6 which includes a hysteresis circuit for the comparator with modified input offset voltage. The hysteresis circuit includes transistors P11" and P12", and the input offset voltage is modified to provide a controlled input offset voltage by having N1" with larger gate width-to-length ratio (W/L) than that of N2". The reason for these two features is to compensate for the natural deficiencies of the comparator in terms of its equivalent input noise voltage and the inherent mismatch of components which always results in a non zero input offset voltage for the comparator. The reason why a hysteresis circuit is so desirable is that it prevents false outputs from the comparator when the difference in the applied input voltages (nodes A 120 and B 121) is of the same magnitude as the equivalent input noise voltage of the comparator.

Figure 7:
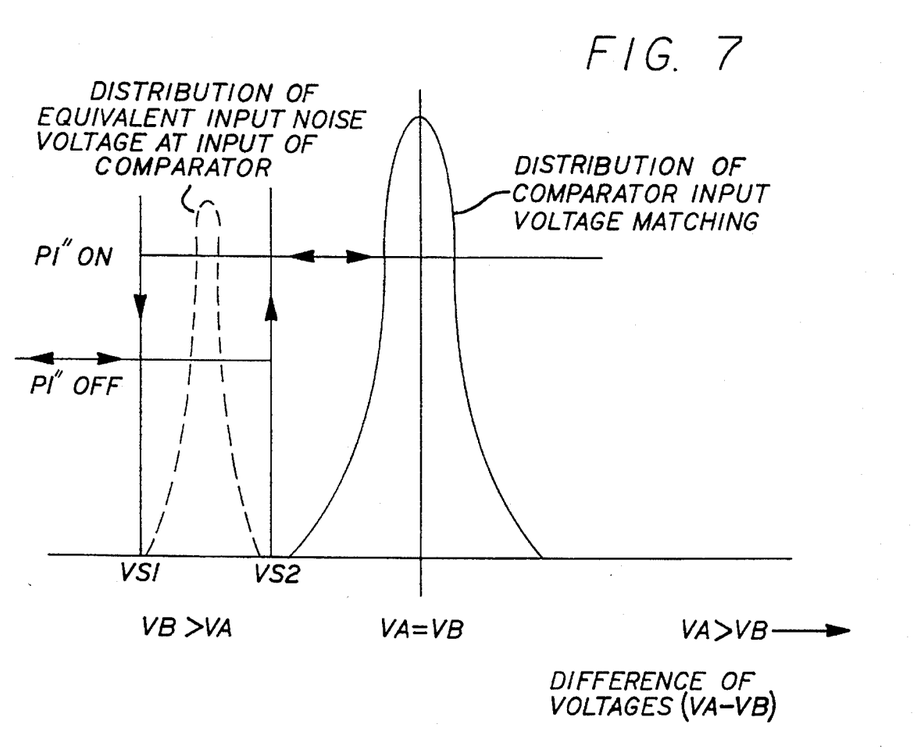
FIG. 7 is the effect of a hysteresis circuit in FIG. 6.

This effect is shown in FIG. 7 where the hysteresis voltage (VS1–VS2) is greater than the input noise voltage. Similarly the high trip point of the comparator is offset by an amount equal or greater than the worse case value of its offset voltage. Typically VS2 would be set about 15 millivolts from ideal matching and VS1 about 25 millivolts. The down side of this technique is that reverse current will flow in the pass transistor when the output is higher than the input voltage by not more than about 25 millivolts. The closer the two trip points VS1 and VS2 are to ideal matching the better. Therefore, for best performance the design of the comparator should be optimzed for low offset voltage and low noise.

FIG. 8 is a block schematic of a practical implementation of a low dropout negative series regulator incorporating an NMOS substrate snatcher circuit and a medium precision polarity detector circuit in accordance with the present invention. The circuit in FIG. 8 is similar in structure and function to that of FIG. 4 except that (1) NMOS transistors are replaced with PMOS transistors, (2) PMOS transistors are replaced with NMOS transistors, (3) input and output voltages at nodes 150 and 151 are lower than the voltage at 155, and (4) the circuit in FIG. 8 is up-side-down with respect to the circuit in FIG. 4.

The circuit in FIG. 4 has an NMOS pass transistor N1''' having a source, a drain, a gate and a substrate. When the voltage of an input 150 is less than the voltage of an output 151, a node 156 may be considered to be the source, and a node 157 can be considered to be the drain of N1'''. However, when the voltage of output 151 is less than the voltage of input 151, node 157 may be considered to be the source, and node 156 may be viewed as the drain of N1'''. Thus, because a MOS transistor is bi-directional, a drain and a source are interchangeable.

The drain and the source of N1''' are coupled in series between input 150 and output 151. NMOS transistors N4''' and N5''' are used to connect the substrate of N1''' to either input 150 or output 151. When the voltage of input 150 is lower than the voltage of output 151, the substrate of N1''' is connected to input 150 through N4'''. When the voltage of output 151 is lower than the voltage of input 150, the substrate of N1''' is connected to output 151 through N5'''.

NMOS transistors N7''' and N6''' are used to turn on or off N1''' based on the relative magnitudes of the voltages of input 150 and output 151. When the voltage of input 150 is less than the voltage of output 151, N7''' is on, connecting N1''' to a gate drive 153. Gate drive 153 controls the gate of N1''', turning on or off N1'''. When the voltage of output 151 is less than the voltage of input 150, N6''' is on, connecting N1''' to output 151 through N6'''. Since the gate of N1''' is connected to output 151 through N6''' and node 157 is also connected to output 151, N1''' is off.

Continuing to refer to FIG. 8, a comparator consisting of PMOS transistors P1''' and P2''' with NMOS transistors N8''' and N9''' is connected to an inverter N10''' to compare the voltages of input 150 and output 151 and to control the gates of N4''', N5''', N6''' and N7'''. A reference voltage 155 may be ground or some other voltage level. When reference voltage is ground, input 150 and output 151 are negative values. When input 150 is less than output 151, the absolute value of the voltage of input 150 is greater than the absolute value of the voltage of output 151. One should note that improvements similar to those shown in FIGS. 5 and 6 may be made to the circuit in FIG. 8.

Thus, while the present invention has been disclosed and described with respect to a certain preferred embodiment thereof, it will be understood to those skilled in the art that the present invention may be varied without departing from the spirit and scope of the invention.

I claim:

1. A circuit for coupling between a first and a second terminals for providing a minimum reverse current low dropout voltage output comprising:

a MOS pass transistor having a source, a drain, a gate and a substrate, the source and the drain of the MOS pass transistor being coupled in series between the first terminal and the second terminal;

connection means for connecting the substrate of the MOS pass transistor to either one of the first terminal and the second terminal based on relative magnitudes of voltages of the first terminal and the second terminal, the connection means coupled to the MOS pass transistor, to the first terminal and to the second terminal;

switch means for controlling the gate of the MOS pass transistor based on the relative magnitudes of the voltages of the first terminal and the second terminal, the switch means coupled to the MOS pass transistor; and comparison and control means for (1) comparing the voltage of the first terminal and the voltage of the second terminal and for (2) controlling the connection means and the switch means, the comparison and control means coupled to the connection means, to the switch means, to the first terminal and to the second terminal.

2. The circuit of claim 1 wherein the MOS pass transistor is a PMOS transistor, and the first terminal is a positive power supply terminal.

3. The circuit of claim 1 wherein the connection means includes:

a first MOS transistor having a source, a drain, a gate and a substrate wherein the substrate and the drain of the first MOS transistor are both coupled to the substrate of the MOS pass transistor and the source of the first MOS transistor is coupled to the first terminal; and a second MOS transistor having a source, a drain, a gate and a substrate wherein the substrate and the drain of the second MOS transistor are both coupled to the substrate of the MOS pass transistor and the source of the second MOS transistor is coupled to the second terminal.

4. The circuit of claim 3 wherein the switch means includes:

a third MOS transistor having a source, a drain, a gate and a substrate wherein the source of the third MOS transistor is coupled to a gate control line of the MOS pass transistor, the substrate of the third MOS transistor is coupled to the substrate of the MOS pass transistor, and the drain of the third MOS transistor is coupled to the gate of the MOS pass transistor; and a fourth MOS transistor having a source, a drain, a gate and a substrate wherein the source of the fourth MOS transistor is coupled to the gate of the MOS pass transistor, the substrate of the fourth MOS transistor is coupled to the substrate of the MOS pass transistor, and the drain of the fourth MOS transistor is coupled to the second terminal;

wherein the MOS pass transistor is on when an absolute value of the voltage of the first terminal is greater than an absolute value of the voltage of the second terminal, and the MOS pass transistor is off when the absolute value of the voltage of the second terminal is greater than the absolute value of the voltage of the first terminal.

5. The circuit of claim 4 wherein the comparison and control means includes a differential comparator circuit and an inverter circuit.

6. The circuit of claim 5 wherein the differential comparator circuit includes:

a fifth MOS transistor having a source, a drain, and a gate wherein the drain of the fifth MOS transistor is coupled to an intermediate circuit, the intermediate circuit is coupled to the drain of the first MOS transistor, and the gate of the fifth MOS transistor is coupled to the first terminal so that the fifth MOS transistor is on when the voltage of the first terminal exceeds a turn-on voltage of the fifth MOS transistor; and a sixth MOS transistor having a source, a drain, a gate and a substrate wherein the source of the sixth MOS transistor is connected to the source of the fifth MOS transistor, the drain of the sixth MOS transistor is coupled to the gates of the second and fourth MOS transistors, and the gate of the sixth MOS transistor is coupled to the second terminal so that the sixth MOS transistor is on when the voltage of the second terminal exceeds a turn-on voltage of the sixth MOS transistor.

7. The circuit of claim 6 wherein the inverter circuit includes a seventh MOS transistor having a source, a drain, a gate, and a substrate wherein the source and substrate of the seventh MOS transistor are both coupled to the drain of the second MOS transistor and to the substrate of the MOS pass transistor, the gate of the seventh MOS transistor is coupled to the drain of the sixth MOS transistor, and the drain of the seventh MOS transistor is coupled to the gates of the first and third MOS transistors.

8. The circuit of claim 4 wherein the substrate of the MOS pass transistor is connected to some of the substrates of the connection means and to some of the substrates of the switch means wherein the substrates of the MOS pass transistor, of the connection means and of the switch means are part of either of discrete components and integrated components.

9. The circuit of claim 3 wherein the first MOS transistor is on, and the second MOS transistor is off when an absolute value of the voltage of the first terminal is greater than an absolute value of the voltage of the second terminal wherein the substrate of the MOS pass transistor is connected to the first terminal through the first MOS transistor; and the first MOS transistor is off, and the second MOS transistor is on when the absolute value of the voltage of the second terminal is greater than the absolute value of the voltage of the first terminal wherein the substrate of the MOS pass transistor is connected to the second terminal through the second MOS transistor.

10. The circuit of claim 4 wherein the fourth MOS transistor is off, and the third MOS transistor is on when an absolute value of the voltage of the first terminal is greater than an absolute value of the voltage of the second terminal so that the gate control line of the MOS pass transistor controls the gate of the MOS pass transistor; and alternatively the third MOS transistor is off, and the fourth MOS transistor is on when the absolute value of the voltage of the second terminal is greater than the absolute value of the voltage of the first terminal so that the gate of the MOS pass transistor is connected to the second terminal, and thus the MOS pass transistor is off.

11. The circuit of claim 7 wherein the seventh MOS transistor provides to each of the gate of the first MOS transistor and the gate of the third MOS transistor a signal that is inverted from a signal to each of the gate of the second MOS transistor and the gate of the fourth MOS transistor so that when the first and third MOS transistors are on, the second and fourth MOS transistors are off.

12. The circuit of claim 1 wherein the MOS pass transistor is a NMOS transistor, and the first terminal is a negative power supply terminal.

13. A method for providing a minimum reverse current low dropout voltage output through a circuit, comprising a MOS pass transistor having a source, a drain, a gate and a substrate between the first and the second terminals by coupling the source and the drain of the MOS pass transistor in series between the two terminals, said method comprising the steps of:

comparing a voltage of the first terminal with a voltage of the second terminal;

connecting the substrate of the MOS pass transistor to either one of the first terminal and the second terminal through a second circuit based on relative magnitudes of voltages of the first terminal and the second terminal; and controlling the gate of the MOS pass transistor based on the relative magnitudes of the voltages of the first terminal and the second terminal.

14. A circuit for coupling between a first terminal and a second terminal for providing a minimum reverse current low dropout voltage output comprising:

a MOS pass transistor having a source, a drain, a gate and a substrate, the source and the drain of the MOS pass transistor being coupled in series between the first terminal and the second terminal;

a first and a second transistors, each having a source, a drain, a gate, and a substrate;

the drains of the first and the second transistors and the substrates of the first, the second, and the MOS pass transistors being coupled together;

the source of the first transistor being coupled to the first terminal;

the source of the second transistor being coupled to the second terminal;

the gate of the first transistor being coupled to a first intermediate circuit, the first intermediate circuit coupled to the second terminal;

the gate of the second transistor being coupled to a second intermediate circuit, the second intermediate circuit being coupled to the first terminal; and the gate of the MOS pass transistor being coupled to a third intermediate circuit, the third intermediate circuit including a third transistor and a fourth transistor, each having a source, a drain, a gate, and a substrate, the substrates of the third and fourth transistors both being coupled to the substrates of the MOS pass transistor, the first and the second transistors, the drain of the third transistor being coupled to the gate of the MOS pass transistor, the source of the fourth transistor being coupled to the gate of the MOS pass transistor, the source of the third transistor being coupled to a gate drive line, the drain of the fourth transistor being coupled to the second terminal, the gate of the third transistor being coupled to the gate of the first transistor, and the gate of the fourth transistor being coupled to the gate of the second transistor;

wherein the substrate of the MOS pass transistor is electrically coupled to the first terminal when the first transistor is on, and the substrate of the MOS pass transistor is electrically coupled to the second terminal when the second transistor is on;

wherein relative voltages of the first terminal and the second terminal control the gates of the first, second, third and fourth transistors.

15. The circuit of claim 14 wherein the substrate of the MOS pass transistor is connected to the first terminal when an absolute value of the voltage of the first terminal is greater than an absolute value of the voltage of the second terminal and is connected to the second terminal when an absolute value of the voltage of the second terminal is greater than an absolute value of the voltage of the first terminal to minimize the reverse current through the MOS pass transistor.

16. The circuit of claim 14 wherein the third transistor is on, and the fourth transistor is off when an absolute value of the voltage of the first terminal is greater than an absolute value of the voltage of the second terminal so that a gate control line of the MOS pass transistor controls the gate of the MOS pass transistor; and the third transistor is off, and the fourth transistor is on when the absolute value of the voltage of the second terminal is greater than the absolute value of the voltage of the first terminal so that the gate of the MOS pass transistor is connected to the second terminal, and thus the MOS pass transistor is off.

17. The circuit of claim 14 wherein the first intermediate circuit comprising:

a fifth transistor, a sixth transistor, and a seventh transistor, each having a source, a drain, and a gate;

the sources of the fifth and the sixth transistors being coupled together and the source of the seventh transistor being coupled to the drain of the second transistor;

the gate of the fifth transistor being coupled to the first terminal;

the gate of the sixth transistor being coupled to the second terminal; and the drain of the sixth transistor being coupled to the gates of the second, the fourth, and the seventh transistors, and the drain of the seventh transistor being coupled to the gates of the first and the third transistors.

18. The circuit of claim 17 wherein the seventh transistor provides to each of the gate of the first transistor and the gate of the third transistor a signal that is inverted from a signal provided to each of the gates of the second and the fourth transistors so that when an absolute value of the voltage of the first terminal is greater than an absolute value of the voltage of the second terminal, the first and the third transistors are on, and the second and the fourth transistors are off, and when the absolute value of the voltage of the second terminal is greater than the absolute value of the voltage of the first terminal, the first and the third transistors are off, and the second and fourth transistors are on.

19. The circuit of claim 17 wherein the first intermediate circuit further comprises:

an eighth transistor, a ninth transistor, a tenth transistor, and an eleventh transistor, each having a substrate, a source, a drain, and a gate;

the sources of the eighth, the ninth, and the tenth transistors and the substrates of the eighth, the ninth, the tenth and the eleventh transistors being connected to the substrate of the MOS pass transistor and the source of the eleventh transistor being connected to the drain of the tenth transistor; and the drain of the eighth transistor being coupled to the gates of the eighth, the ninth and the tenth transistors and to the drain of the fifth transistor;

the drains of the ninth and eleventh transistors being coupled to the gate of the seventh transistor and to the drain of the sixth transistor; and the gate of the eleventh transistor being coupled to the drain of the seventh transistor wherein detection of a difference in voltages between the first and second terminals is improved.

20. A reverse current limited circuit coupled between a first and a second terminals comprising:

a first circuit coupled between the first and the second terminals, the first circuit including a pass transistor;

a second circuit coupled between the first and the second terminals and to the pass transistor in order to minimize the reverse current flowing through the pass transistor in response to a relative magnitude difference of voltages of the first and the second terminals;

a third circuit coupled to the pass transistor and the second terminal in order to activate and deactivate the pass transistor in response to the relative magnitude difference of the voltages of the first and the second terminals; and a fourth circuit coupled to the first and second terminals, the second circuit and the third circuit, the fourth circuit detects the relative magnitude difference of the voltages of the first and second terminals and controls the second and the third circuits.

21. The circuit of claim 17, wherein the second intermediate circuit is identical to the first intermediate circuit.

22. The circuit of claim 4, wherein a control circuit is coupled to the gate control line.

* * * * *

UNITED STATES PATENT AND TRADEMARK OFFICE
CERTIFICATE OF CORRECTION

PATENT NO. : 5,594,381
DATED : January 14, 1997
INVENTOR(S) : Bingham

It is certified that error appears in the above-identified patent and that said Letters Patent is hereby corrected as shown below:

<u>Column 2,</u>
Lines 19-20, between "circuit of" and "FIG. 3" delete hard return and new paragraph indentation.

Signed and Sealed this

Twenty-first Day of May, 2002

Attest:

JAMES E. ROGAN
*Attesting Officer*  *Director of the United States Patent and Trademark Office*